US006964910B2

(12) United States Patent
Tran

(10) Patent No.: US 6,964,910 B2
(45) Date of Patent: *Nov. 15, 2005

(54) METHODS OF FORMING CONDUCTIVE CAPACITOR PLUG IN A MEMORY ARRAY

(75) Inventor: Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/612,839

(22) Filed: Jul. 3, 2003

(65) Prior Publication Data

US 2004/0097085 A1 May 20, 2004

Related U.S. Application Data

(63) Continuation of application No. 09/359,956, filed on Jul. 22, 1999, now Pat. No. 6,589,876.

(51) Int. Cl.[7] .................................................. H01L 21/20

(52) U.S. Cl. ....................... 438/398; 438/253; 438/255; 438/396; 438/700

(58) Field of Search ................................. 438/253–254, 438/396–397

(56) References Cited

U.S. PATENT DOCUMENTS

| | | | | |
|---|---|---|---|---|
| 5,279,989 A | | 1/1994 | Kim | |
| 5,296,400 A | | 3/1994 | Park et al. | |
| 5,356,834 A | | 10/1994 | Sugimoto et al. | |
| 5,383,088 A | | 1/1995 | Chapple-Sokol et al. | |
| 5,488,011 A | | 1/1996 | Figura et al. | |
| 5,627,095 A | | 5/1997 | Koh et al. | |
| 5,663,092 A | | 9/1997 | Lee | |
| 5,670,404 A | | 9/1997 | Dai | |
| 5,688,713 A | | 11/1997 | Linliu et al. | |
| 5,706,164 A | | 1/1998 | Jeng | |
| 5,721,154 A | | 2/1998 | Jeng | |
| 5,748,521 A | | 5/1998 | Lee | |
| 5,773,342 A | | 6/1998 | Fukase | |
| 5,780,338 A | | 7/1998 | Jeng et al. | |
| 5,789,289 A | | 8/1998 | Jeng | |
| 5,789,304 A | | 8/1998 | Fischer et al. | |
| 5,792,687 A | | 8/1998 | Jeng et al. | |
| 5,837,577 A | | 11/1998 | Cherng | |
| 5,874,756 A | | 2/1999 | Ema et al. | |
| 5,933,726 A | | 8/1999 | Nishimura et al. | |
| 6,060,351 A | * | 5/2000 | Parekh et al. | 438/253 |
| 6,137,179 A | * | 10/2000 | Huang | 257/763 |
| 6,458,649 B1 | | 10/2002 | Zahurak et al. | |

FOREIGN PATENT DOCUMENTS

| | | |
|---|---|---|
| EP | 06029408 | 2/1994 |
| EP | 09074174 | 3/1997 |
| EP | 10289986 | 10/1998 |
| JP | 6-29408 | 2/1994 |
| JP | 9-74174 | 3/1997 |
| JP | 10-289986 | 10/1998 |

OTHER PUBLICATIONS

U.S. Appl. No. 08/998,023, Parekh et al.; filed Dec. 24, 1997.

* cited by examiner

*Primary Examiner*—Dung A. Le
(74) *Attorney, Agent, or Firm*—Wells St. John, P.S.

(57) ABSTRACT

Methods of forming conductive capacitor plugs, methods of forming capacitor contact openings, and methods of forming memory arrays are described. In one embodiment, a conductive capacitor plug is formed to extend from proximate a substrate node location to a location elevationally above all conductive material of an adjacent bit line. In another embodiment, a capacitor contact opening is etched through a first insulative material received over a bit line and a word line substantially selective relative to a second insulative material covering portions of the bit line and the word line. The opening is etched to a substrate location proximate the word line in a self-aligning manner relative to both the bit line and the word line. In another embodiment, capacitor contact openings are formed to elevationally below the bit lines after the bit lines are formed. In a preferred embodiment, capacitor-over-bit line memory arrays are formed.

22 Claims, 10 Drawing Sheets

METHODS OF FORMING CONDUCTIVE CAPACITOR PLUG IN A MEMORY ARRAY

RELATED PATENT DATA

This patent resulted from a continuation application of and claims priority to U.S. patent application Ser. No. 09/359,956, filed Jul. 22, 1999 now U.S. Pat. No. 6,589,876, entitled "Methods of Forming Conductive Capacitor Plugs, Methods of Forming Capacitor Contact Openings, and Methods of Forming Memory Arrays", naming Luan C. Tran as inventor, and the disclosure of which is incorporated by reference.

TECHNICAL FIELD

This invention relates to methods of forming conductive capacitor plugs, to methods of forming capacitor contact openings, and to methods of forming memory arrays.

BACKGROUND OF THE INVENTION

Semiconductor processing involves a number of processing steps in which individual layers are masked and etched to form semiconductor components. Mask alignment is important as even small misalignments can cause device failure. For certain photomasking steps, proper alignment is extremely critical to achieve proper fabrication. In others, design rules are more relaxed allowing for a larger margin for alignment errors. One way in which design rules can be relaxed is to provide processing sequences which enable so-called self aligned etches, such as to encapsulated word lines in the fabrication of memory circuitry. Further, there is a goal to reduce or minimize the number of steps in a particular processing flow. Minimizing the processing steps reduces the risk of a processing error affecting the finished device, and reduces cost.

This invention arose out of needs associated with improving the manner in which semiconductor memory arrays, and in particular capacitor-over-bit line memory arrays, are fabricated.

SUMMARY OF THE INVENTION

Methods of forming conductive capacitor plugs, methods of forming capacitor contact openings, and methods of forming memory arrays are described. In one embodiment, a conductive capacitor plug is formed to extend from proximate a substrate node location to a location elevationally above all conductive material of an adjacent bit line. In another embodiment, a capacitor contact opening is etched through a first insulative material received over a bit line and a word line substantially selective relative to a second insulative material covering portions of the bit line and the word line. The opening is etched to a substrate location proximate the word line in a self-aligning manner relative to both the bit line and the word line. In another embodiment, capacitor contact openings are formed to elevationally below the bit lines after the bit lines are formed. In a preferred embodiment, capacitor-over-bit line memory arrays are formed.

BRIEF DESCRIPTION OF THE DRAWINGS

Preferred embodiments of the invention are described below with reference to the following accompanying drawings.

FIG. 17 is a view of a semiconductor wafer fragment in process, in accordance with another embodiment of the invention. The FIG. 17 view coincides to processing which can occur after the view depicted in FIG. 12.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
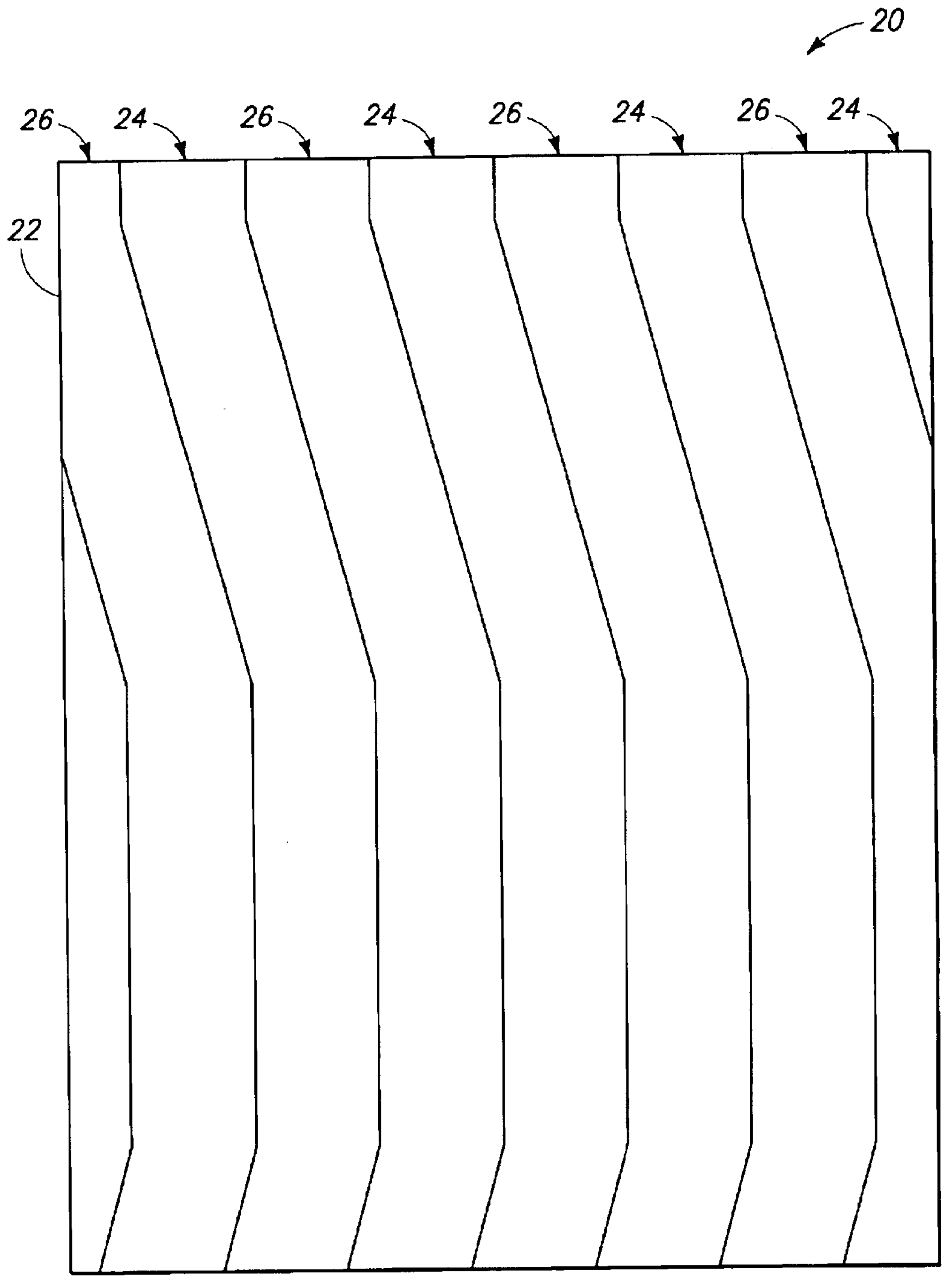
FIG. 1 is a top plan view of the semiconductor wafer fragment in process in accordance with one embodiment of the invention.

Referring to FIG. 1, a semiconductor wafer fragment 20 in process in accordance with one embodiment of the invention includes a semiconductive substrate 22. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 22 includes a plurality of active areas 24 and a plurality of isolation regions 26. Isolation regions 26 can be formed through various techniques including shallow trench isolation.

Figure 2:
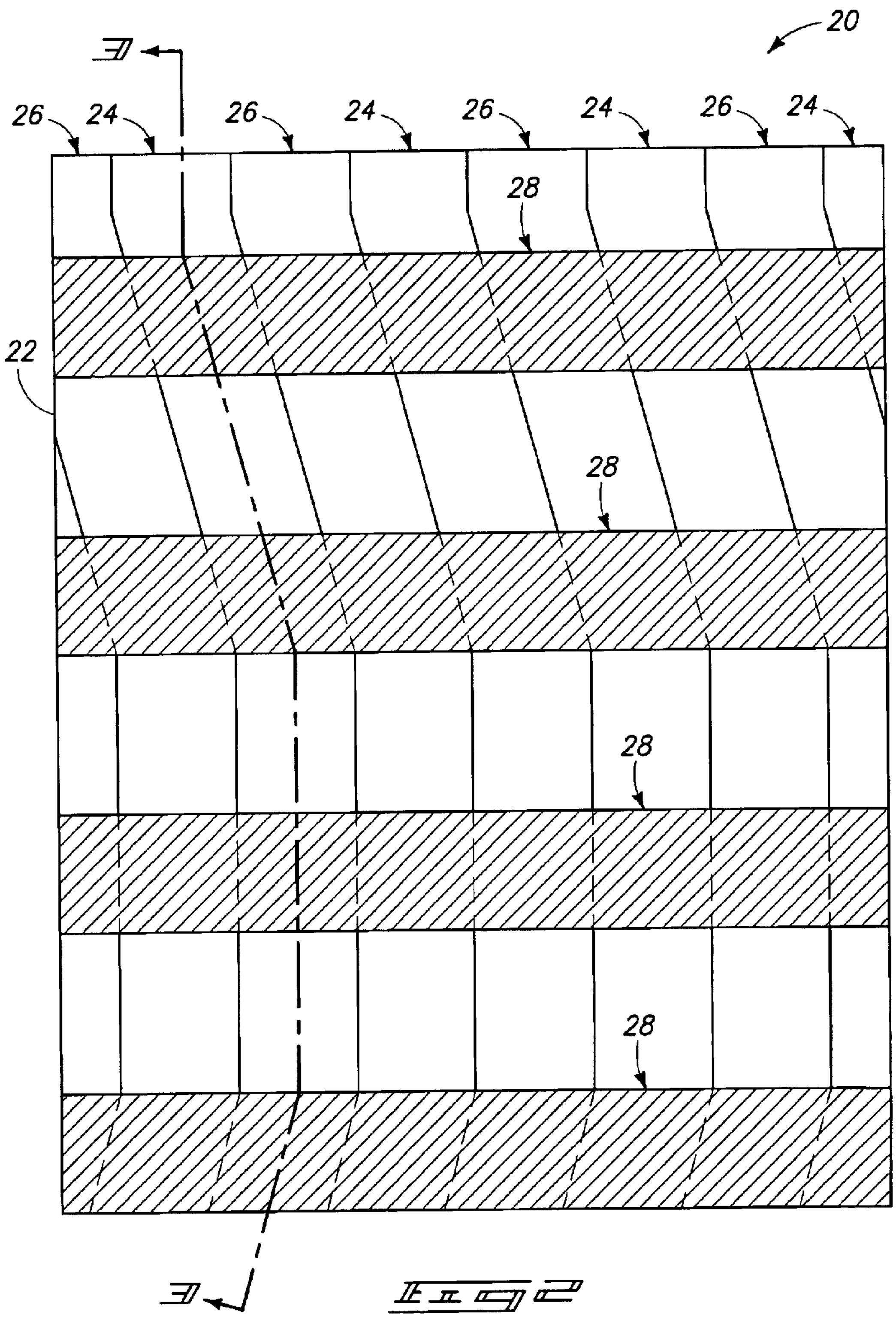
FIG. 2 is a view of the FIG. 1 wafer fragment at a different processing step.
Figure 3:
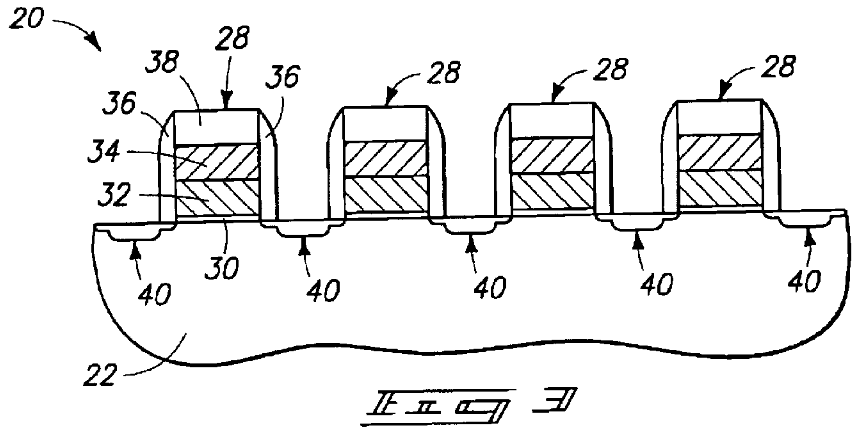
FIG. 3 is a view which is taken along line 3—3 in FIG. 2.

Referring to FIGS. 2 and 3, a plurality of conductive lines 28 are formed over substrate 22 and constitute word lines of a memory array which is to be formed. Each of word lines 28 includes a gate oxide layer 30, a conductive polysilicon layer 32, and an overlying silicide layer 34. Insulative coverings are formed over individual word lines 28 and include sidewall spacers 36 and an insulative cap 38. The insulative coverings preferably encapsulate the word lines. Exemplary insulative materials include oxide formed through decomposition of TEOS, or nitride/oxynitride materials. Diffusion regions 40 are provided and formed intermediate word lines 28 and define substrate node locations with which electrical communication is desired. The illustrated diffusion regions include lightly doped drain (LDD) regions (not specifically designated).

Figure 4:
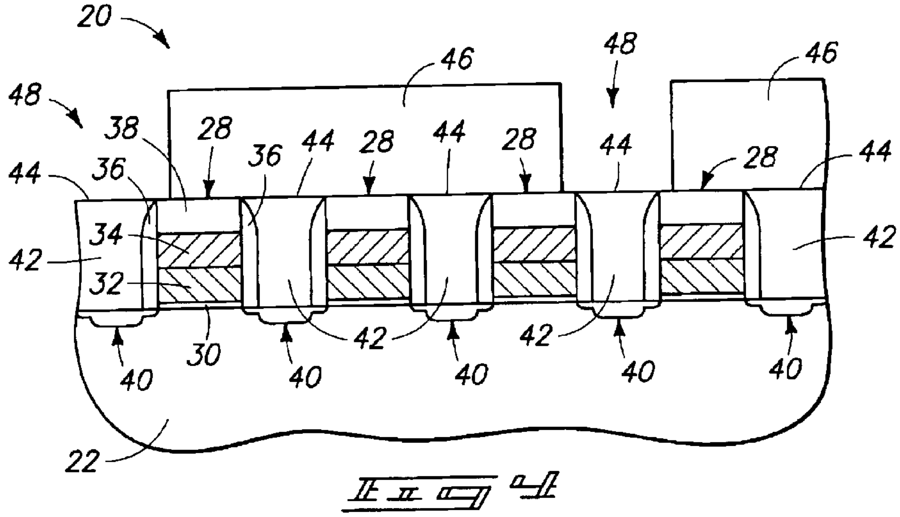
FIG. 4 is a view of the FIG. 3 wafer fragment at a different processing step.

Referring to FIG. 4, a first layer 42 is formed over substrate 22 and between conductive lines 28 and comprises a first insulative material which is different from the insulative material covering or encapsulating word lines 28. An exemplary material is borophosphosilicate glass (BPSG) which can be subsequently reflowed and planarized as by conventional techniques to provide a generally planar uppermost surface 44. A first masking layer 46 is formed over the substrate and defines a plurality of bit line plug mask openings 48. An exemplary material is photoresist.

Figure 5:
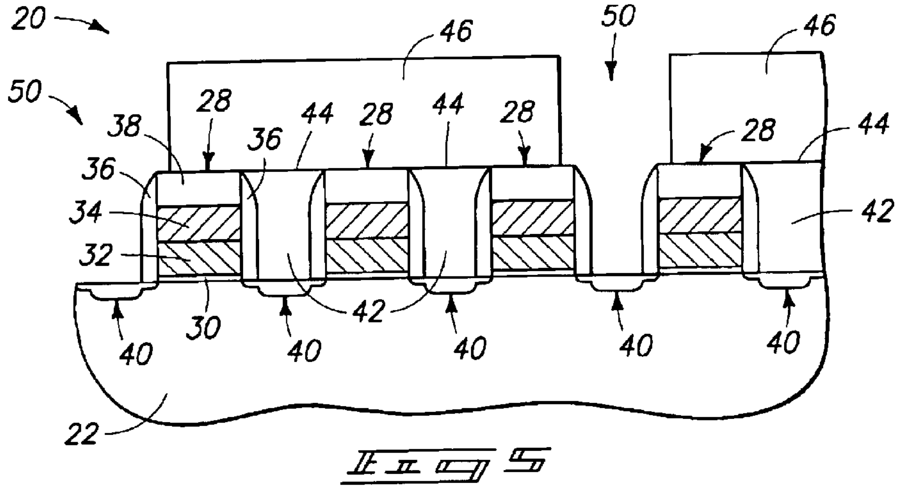
FIG. 5 is a view of the FIG. 4 wafer fragment at a different processing step.

Referring to FIG. 5, material of first layer 42 is etched through bit line plug mask openings 48 and individual substrate diffusion regions 40 between selected word lines 28 are preferably exposed. Such etching forms bit plug openings 50 intermediate the selected word lines.

Figure 6:
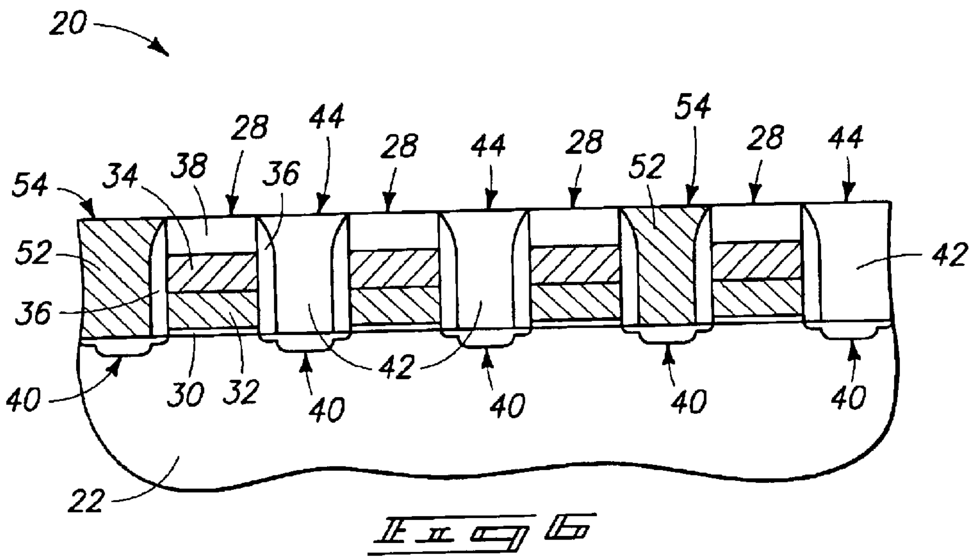
FIG. 6 is a view of the FIG. 5 wafer fragment at a different processing step.

Referring to FIG. 6, conductive material 52 is formed over and in electrical communication with the individual substrate diffusion regions 40 beneath bit plug openings 50 (FIG. 5). An exemplary material is conductively doped polysilicon which can be deposited, and portions subsequently removed, to isolate the conductive material within the bit plug openings and form individual plugs 54. Plugs 54 can be formed by chemical mechanical polishing conductive material 52 or through various etch back techniques.

Figure 7:
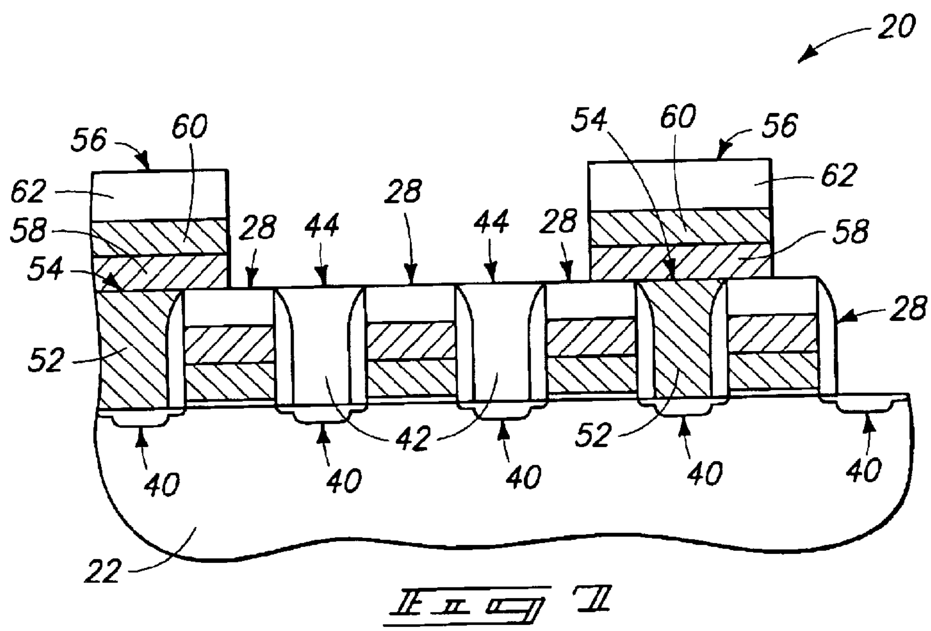
FIG. 7 is a view of the FIG. 6 wafer fragment at a different processing step.
Figure 8:
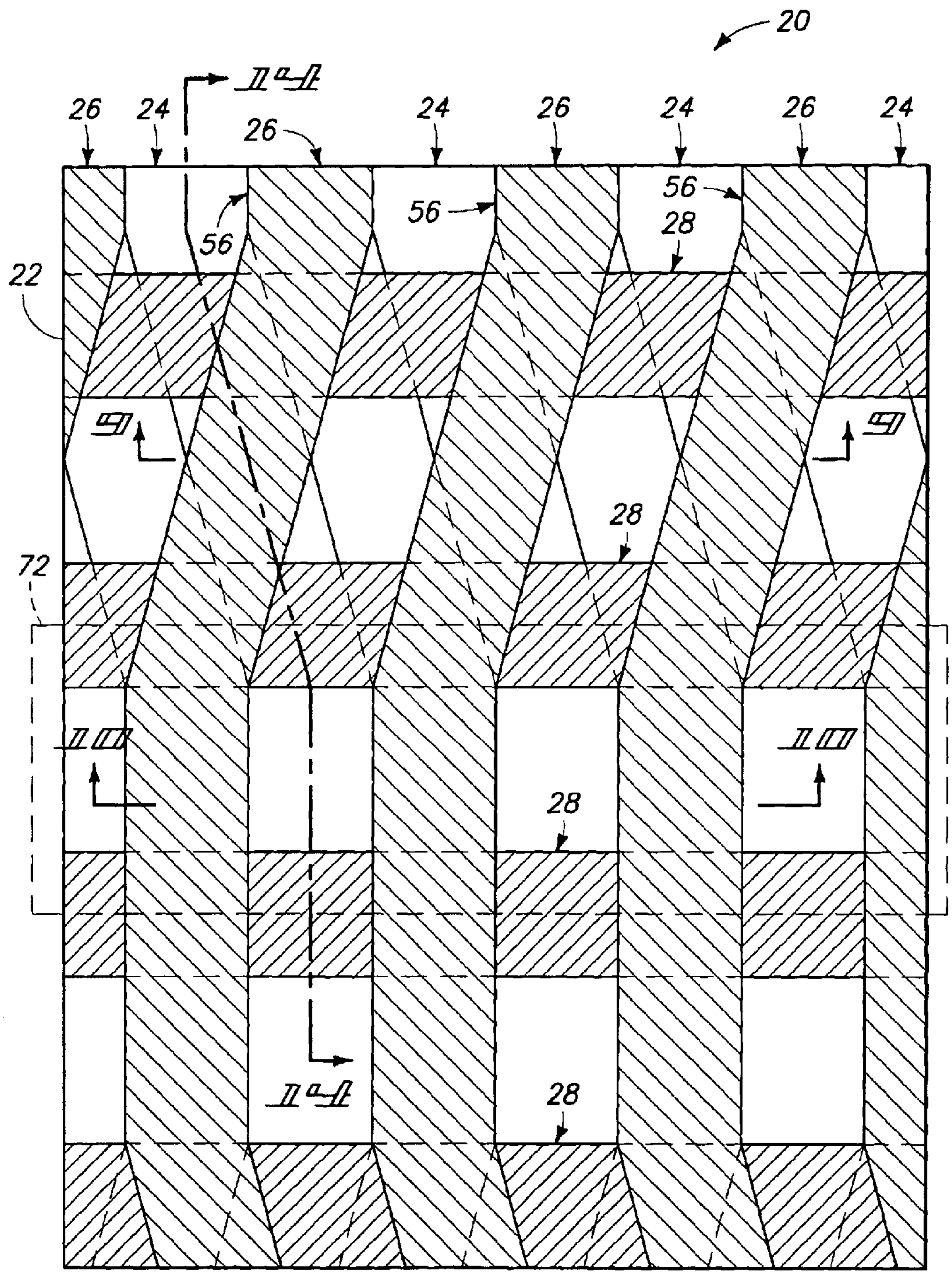
FIG. 8 is a view of the FIG. 2 wafer fragment at a different processing step.

Referring to FIGS. 7 and 8, individual bit lines 56 are formed and in electrical communication with respective individual conductive bit line plugs 54. Bit lines 56 are formed over insulative material 42 and the illustrated word lines 28. Bit lines 56 include a polysilicon layer 58 and a silicide or other conductive layer 60 (i.e., tungsten). An insulative covering 62 is formed over conductive material of the bit lines and can comprise a suitable oxide, such as one formed through decomposition of TEOS, or nitride/oxynitride materials. The various bit line layers are preferably blanket deposited over the substrate and subsequently photomasked and etched to provide the illustrated bit lines (FIG. 8). Alternately, the bit line plug and the bit line can comprise a common material deposited during the same processing step. For example, layers 52 and 58 could comprise the same material which is deposited thick enough to form both the conductive plug and some or all of bit lines 56.

Figure 9:
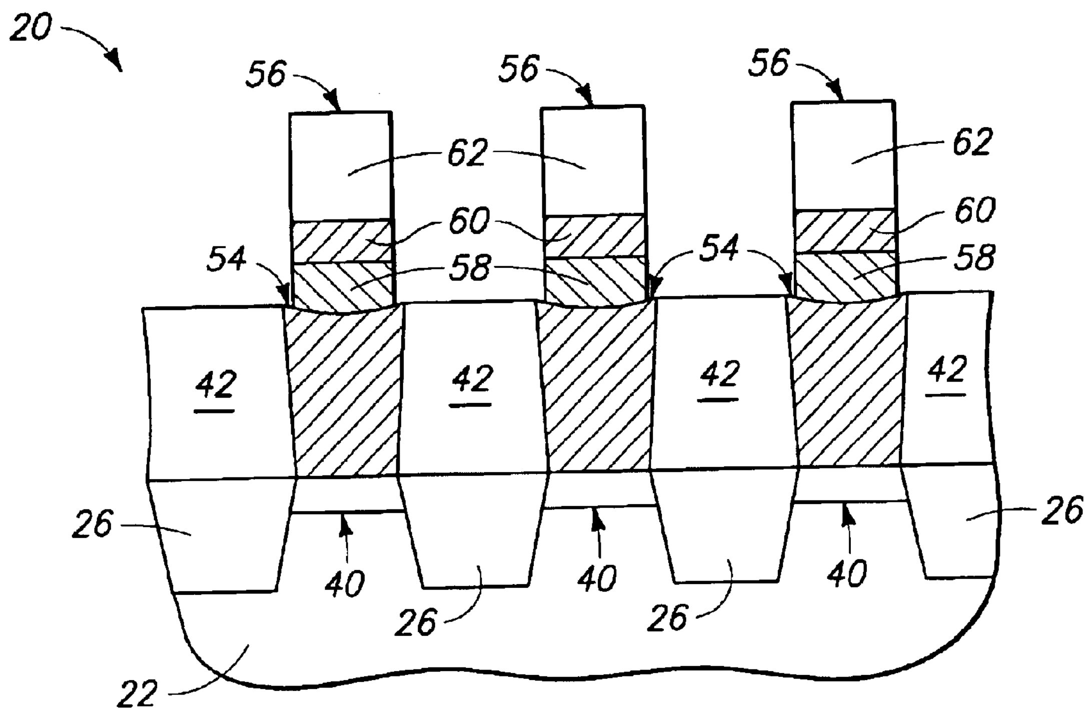
FIG. 9 is a view which is taken along line 9—9 in FIG. 8.

Referring to FIG. 9, a view is shown which is taken along line 9—9 in FIG. 8 and cuts across three individual bit line plugs 54 and their associated bit lines 56.

Figure 10:
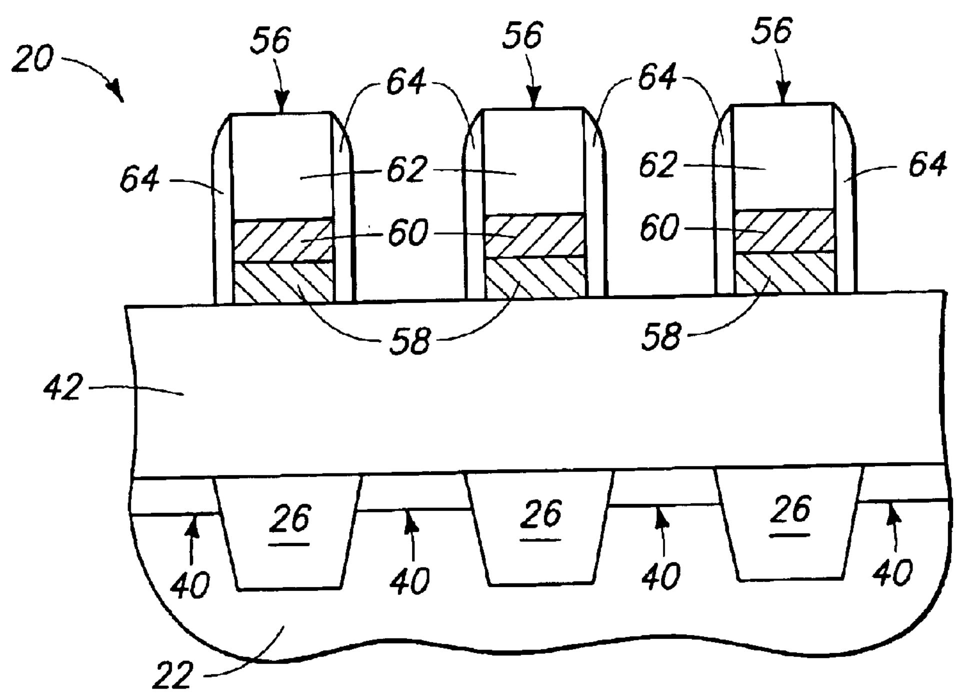
FIG. 10 is a view of the FIG. 9 wafer fragment at a different processing step.

Referring to FIG. 10, a layer of insulative material is formed over substrate 22 and etched to provide insulative coverings in the form of sidewall spacers 64. Sidewall spacers 64 together with insulative coverings 62 serve to encapsulate the individual bit lines. It will be appreciated, however, that the insulative material which ultimately becomes sidewall spacers 64 need not be etched to form the sidewall spacers at this time. Exemplary materials for insulative material 64 include oxide formed through decomposition of TEOS, or nitride/oxynitride materials. In a preferred embodiment, the insulative material which is utilized to encapsulate the word lines (FIG. 3) is the same material which is utilized to encapsulate the bit lines.

Figure 11:
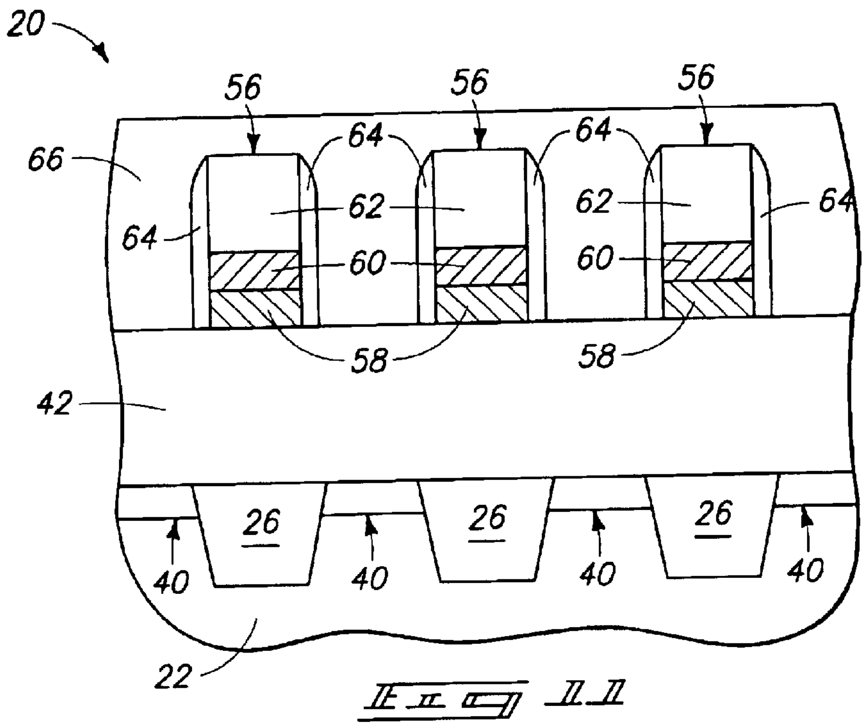
FIG. 11 is a view of the FIG. 10 wafer fragment at a different processing step.

Referring to FIG. 11, a second layer 66 is formed over the word lines and bit lines 56, and preferably comprises the first insulative material which was formed over word lines 28, e.g. BPSG. Such layer is preferably reflowed and planarized. Layers 42, 66 constitute a plurality of separately-formed layers of first insulative material which, in the preferred embodiment, comprise two layers.

Figure 12:
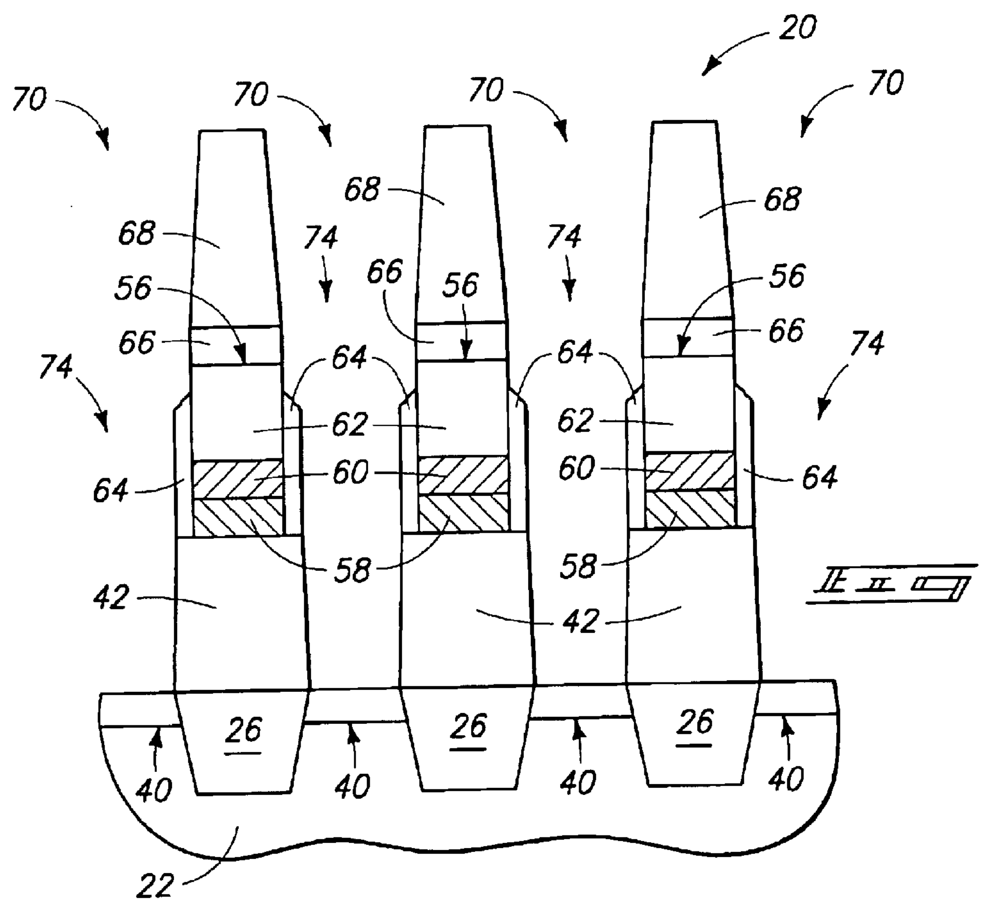
FIG. 12 is a view of the FIG. 11 wafer fragment at a different processing step.

Referring to FIG. 12, a second patterned masking layer 68 is formed over second layer 66 and defines a plurality of opening patterns 70 over various substrate diffusion regions 40. Openings 70 are formed on opposite sides of individual word lines between which individual bit line plugs are formed. A preferred alternative to forming individual openings 70 over the illustrated diffusion regions is to form a so-called stripe opening which can be opened up over a plurality of the diffusion regions, where of the stripe opening intersects with the bit line spaces. An exemplary stripe opening is illustrated in FIG. 8 inside dashed line 72 (FIG. 8).

Whether individual openings 70 are formed in second masking layer 68 or stripe opening 72 is formed, capacitor contact openings 74 are etched through first and second layers of insulative material 42, 66 respectively. In the illustrated example, capacitor contact openings 74 are etched to elevationally below bit lines 56, down to proximate individual word lines of the memory array. In a preferred embodiment, the etching exposes individual diffusion regions 40. In this example, and because individual openings 70 are formed in second masking layer 68, some portions of second layer 66 remain over the individual bit lines. Where, however, the above-mentioned stripe opening 72 (FIG. 8) is formed, all of first insulative material 66 over the individual bit lines would ideally be removed.

In a preferred embodiment, the material which is used to encapsulate both the bit lines and the word lines is selected to comprise the same material, or, a material selective to which layers 42, 66 can be etched. Accordingly, etch chemistries can be selected to etch material of both layers 42, 66 substantially selectively relative to the material encapsulating both the word lines and the bit lines. Hence, capacitor contact openings 74 can be formed in a self-aligning manner to be generally self-aligned to both the bit lines and the word lines. Aspects of the invention also include non-capacitor-over-bit line memory array fabrication processes, and selective etching of contact openings which might not be capacitor contact openings.

Figure 13:
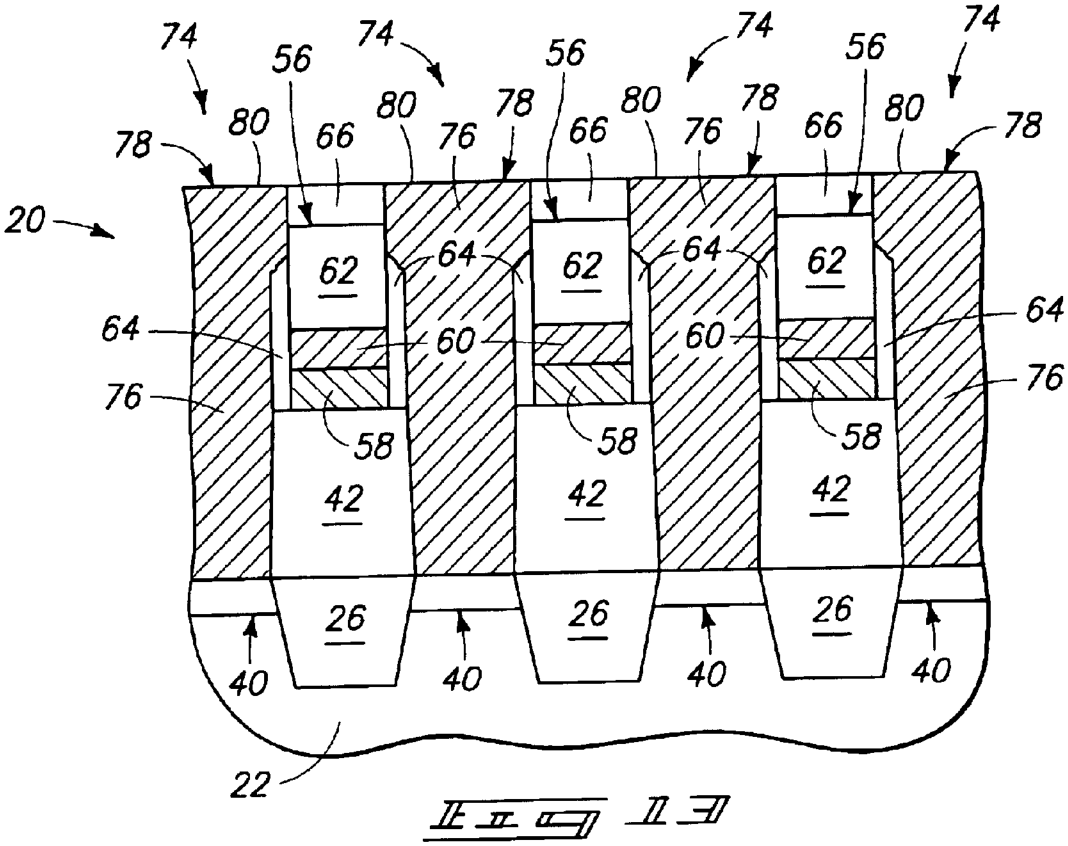
FIG. 13 is a view of the FIG. 12 wafer fragment at a different processing step.
Figure 14:
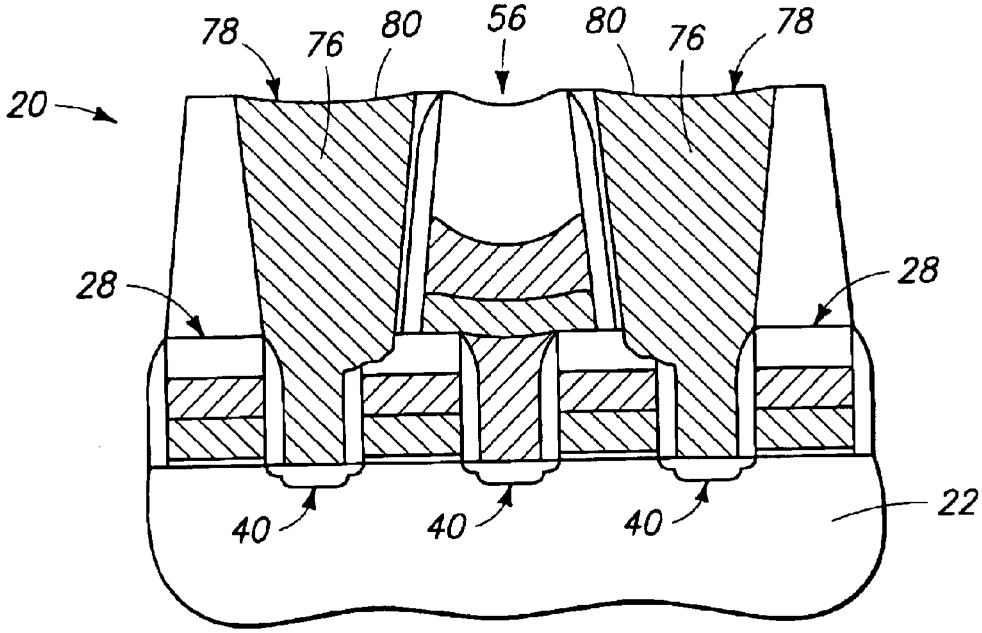
FIG. 14 is a view which is taken along line 14—14 in FIG. 8 and somewhat reduced in dimension.

Referring to FIGS. 13 and 14, conductive material 76 is formed within individual contact openings 74 and in electrical communication with individual respective diffusion regions 40. An exemplary material is conductively doped polysilicon which can be subsequently etched back or chemical mechanical polished to form individual capacitor plugs 78. In the illustrated example, conductive material 76 extends from proximate diffusion regions 40 to respective elevations which are at least laterally proximate (including higher) individual conductive portions of the bit lines. In a preferred embodiment, conductive material 76 extends to locations which are elevationally higher than any conductive portion of any bit line. Individual conductive capacitor plugs 78 include individual surfaces 80 proximate which each plug terminates. Surfaces 80 are disposed at elevations above conductive portions of the bit lines.

Figure 15:
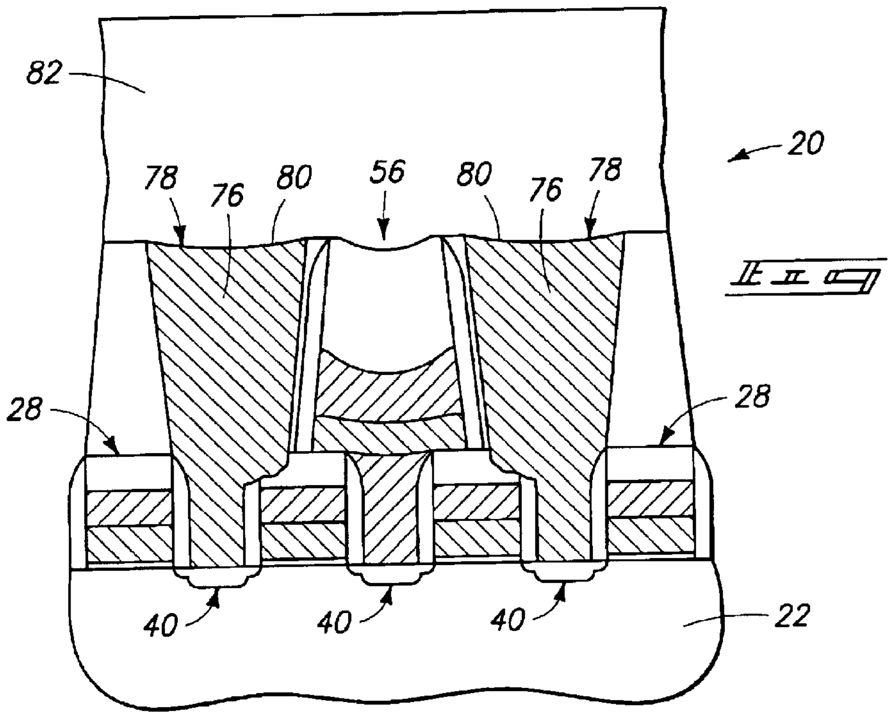
FIG. 15 is a view of the FIG. 14 wafer fragment at a different processing step.
Figure 16:
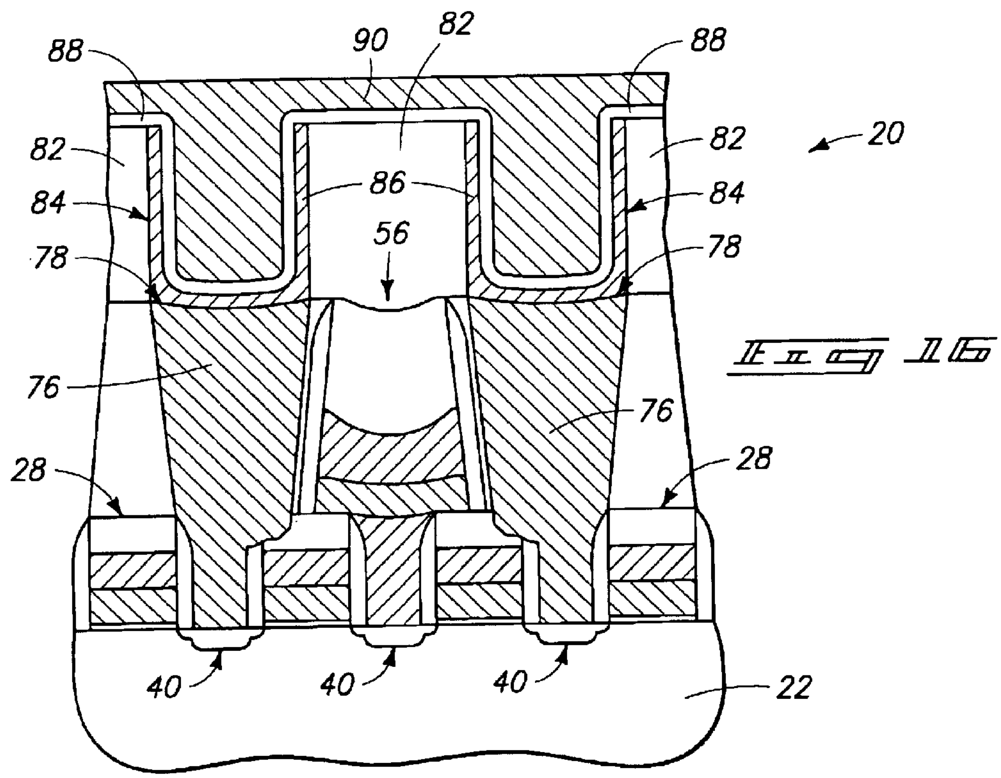
FIG. 16 is a view of the FIG. 15 wafer fragment at a different processing step.
Figure 11:
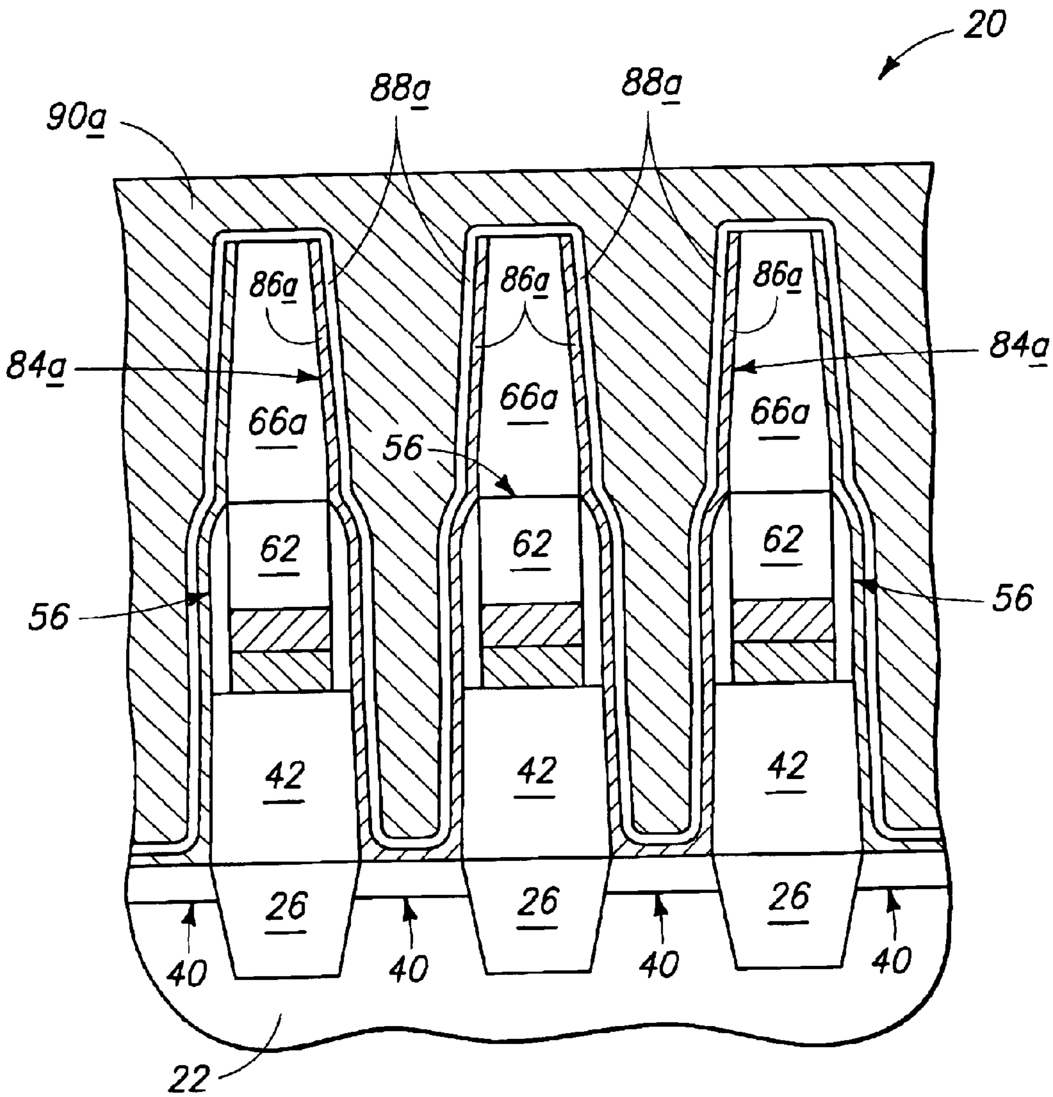

Referring to FIGS. 15 and 16, an insulative layer 82, e.g. BPSG, is formed over the substrate and subsequently patterned and etched to form individual capacitor containers 84 (FIG. 16). Storage capacitors are then formed by depositing a storage node layer 86, a cell dielectric layer 88, and a cell plate layer 90. Accordingly, such constitutes a portion of a capacitor-over-bit line memory array.

In but one aspect, the above methods can facilitate formation of memory circuitry over other techniques wherein the capacitor plugs are formed prior to formation of the bit lines. Such other techniques can present alignment problems insofar capacitor container-to-bit line, and capacitor container-to-word line, alignments are concerned. Aspects of the present invention can permit the capacitor plugs to be formed to be generally self-aligned to both the word lines and the bit lines, while preserving the mask count necessary to form the subject memory arrays. Other aspects of the present invention can ease alignment constraints imposed on capacitor container alignment by removing requirements that the containers be etched to be self-aligned to other structures including the bit lines.

Referring to FIG. 17, and in accordance with an alternate embodiment of the present invention, storage capacitors can be formed directly within contact openings 74 (see FIG. 12) such that capacitor plugs 78 (FIG. 13) are not necessary. Like numbers from the above-described embodiment have been utilized where appropriate, with differences being indicated with the suffix "a". A layer 66*a* is formed over the substrate and subsequently patterned and etched, along with layer 42 as described above, to form capacitor containers 84*a*. Subsequently, storage capacitors are formed by depositing a storage node layer 86*a*, a cell dielectric layer 88*a*, and a cell plate layer 90*a*. Accordingly, such constitutes forming conductive material at least partially within individual contact openings 74. The above storage capacitor constructions are for illustrative purposes only. Accordingly, other constructions are possible. For example, and by way of example only, plugging material 76 of FIGS. 13 and 14 might be etched partially inward to provide more room, and thereby more capacitance, for the capacitor being formed. Further and by way of example only, some or all of the insulative material laterally outside of the capacitor container might be etched away in advance of forming the capacitor dielectric layer to provide more surface area and thereby more capacitance. Memory cells of the invention can be fabricated to occupy $6F^2$, $8F^2$ or other areas, with $6F^2$ being preferred.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a conductive capacitor plug in a memory array, the method comprising extending conductive material from proximate a substrate node location to a location elevationally above all conductive material of an adjacent bit line, wherein the extending comprises etching a contact opening through insulative material after forming said bit line and forming conductive material within the contact opening, wherein the forming of the conductive material comprises forming a storage capacitor at least partially within the contact opening.

2. The method or claim 1, wherein the extending comprises etching a contact opening through two separately-formed insulative material layers, at least a portion of the contact opening being generally self-aligned to said bit line, and forming conductive material within the contact opening.

3. The method of claim 1, wherein the array comprises a word line elevationally below the bit line, and the extending comprises etching a contact opening through insulative material and generally sell-aligned to both said bit line and said word line.

4. The method of claim 3, wherein the insulative material comprises two or more separately-formed insulative material layers.

5. The method of claim 1, wherein the extending comprises:

forming a patterned masking layer over the substrate and defining an opening pattern over said substrate node location;

etching insulative material through the opening pattern sufficient to form a contact opening after forming said bit line; and forming conductive material within the contact opening.

6. The method of claim 5, wherein said opening pattern is formed over a plurality of substrate node locations over which individual capacitors are to be formed.

7. The method of claim 1, wherein said substrate node location comprises a diffusion region, and the extending comprises:

etching a contact opening through insulative material to substantially expose a portion of the diffusion region after forming said bit line; and forming conductive material within the contact opening and in electrical communication with the diffusion region.

8. The method of claim 7, wherein said insulative material comprises two separately-formed layers of insulative material.

9. The method of claim 1, wherein the forming the storage capacitor at least partially within the contact opening comprises forming electrically conductive and electrically insulative material of the storage capacitor within the contact opening.

10. The method of claim 1 wherein the forming the conductive material comprises forming a first electrode of the storage capacitor, and further comprising forming a dielectric layer of the storage capacitor within the contact opening and configured to insulate the first electrode from a second electrode of the storage capacitor.

11. The method of claim 10 further comprising forming at least a portion of the second electrode within the contact opening.

12. A method of forming a conductive capacitor plug in a memory array employing shallow trench isolation, the method comprising extending conductive material from proximate a substrate node location to a location elevationally above all conductive material of an adjacent bit line; and wherein the array comprises a word line elevationally below the bit line, and the extending comprises etching a contact opening through insulative material and generally self-aligned to both said bit line and said word line.

13. The method of claim 12, wherein the extending comprises etching a contact opening through insulative material after forming said bit line and forming conductive material within the contact opening.

14. The method of claim 13, wherein the forming of the conductive material comprises forming a storage capacitor at least partially within the contact opening.

15. The method of claim 12, wherein the extending comprises etching a contact opening through two separately-formed insulative material layers, at least a portion of the contact opening being generally self-aligned to said bit line, and forming conductive material within the contact opening.

16. The method of claim 12, wherein the insulative material comprises two or more separately-formed insulative material layers.

17. The method of claim 12, wherein the extending comprises:

forming a patterned masking layer over the substrate and defining an opening pattern over said substrate node location;

etching insulative material through the opening pattern sufficient to form a contact opening after forming the bit line; and forming conductive material within the contact opening.

18. The method of claim 17, wherein the opening pattern is formed over a plurality of substrate node locations over which individual capacitors are to be formed.

19. The method of claim 12, wherein the substrate node location comprises a diffusion region, and the extending comprises:

etching a contact opening through insulative material to substantially expose a portion of the diffusion region after forming the bit line; and forming conductive material within the contact opening and in electrical communication with the diffusion region.

20. The method of claim 19, wherein the insulative material comprises two separately-formed layers of insulative material.

21. The method of claim 12 wherein the extending the conductive material comprises forming a first electrode of the storage capacitor, and further comprising forming a dielectric layer of the storage capacitor within the contact opening and configured to insulate the first electrode from a second electrode of the storage capacitor.

22. The method of claim 21 further comprising forming at least a portion of the second electrode within the contact opening.

* * * * *